(12) United States Patent
Molnar et al.

(10) Patent No.: US 6,810,242 B2
(45) Date of Patent: Oct. 26, 2004

(54) SUBHARMONIC MIXER (75) Inventors: Alyosha C. Molnar, Berkeley, CA (US); Geoffrey Hatcher, Irvine, CA (US); Rahul Magoon, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 50 days.

(21) Appl. No.: 10/261,152

(22) Filed: Sep. 30, 2002

(65) Prior Publication Data

US 2004/0063419 A1 Apr. 1, 2004

(51) Int. Cl.[7] .................................................. H04B 1/26
(52) U.S. Cl. ..................... 455/326; 455/333; 455/323; 327/355
(58) Field of Search ................................. 455/323, 326, 455/333, 324; 332/105; 375/298, 326; 327/116, 355, 357, 359

(56) References Cited

U.S. PATENT DOCUMENTS

| 4,156,283 | A | * | 5/1979 | Gilbert ........................ 708/835 |
| 5,303,417 | A | * | 4/1994 | Laws .......................... 455/314 |
| 5,574,755 | A | * | 11/1996 | Persico ........................ 375/295 |
| 6,144,845 | A | * | 11/2000 | Durec ......................... 455/285 |
| 6,144,846 | A | * | 11/2000 | Durec ......................... 455/323 |
| 6,348,830 | B1 | * | 2/2002 | Rebeiz et al. ................ 327/355 |
| 6,359,523 | B1 | * | 3/2002 | Kuwano ....................... 332/103 |
| 6,370,372 | B1 | | 4/2002 | Molnar et al. ............... 455/323 |
| 6,373,345 | B1 | * | 4/2002 | Kimppa et al. .............. 332/105 |
| 6,658,066 | B1 | * | 12/2003 | Magoon et al. .............. 375/298 |

OTHER PUBLICATIONS

Liwei Sheng, Jonathan C. Jensen, and Lawrence E. Larson, "A Wide–Bandwidth Si/SiGe HBT Direct Conversion Sub–Harmonic Mixer/Downconverter," IEEE Journal of Solid–State Circuits, vol. 35, No. 9, Sep., 2000, pp. 1329–1337.

L. Sheng, J. Jensen, L. Larson, "A SI/SIGE HBT Sub–Harmonic Mixer/Downconverter," 1999 IEEE BCTM 4.3, pp. 71–74.

* cited by examiner

Primary Examiner—Edward F. Urban
Assistant Examiner—Blane J. Jackson
(74) Attorney, Agent, or Firm—Thomas, Kayden, Horstemeyer & Risley LLP (57) ABSTRACT

A subharmonic mixer and a method of downconverting a received radio frequency signal is described. The subharmonic mixer of the present invention uses two stacks of switching cores with high order symmetry to reduce unwanted harmonic generation and uses transistors to improve headroom.

20 Claims, 7 Drawing Sheets

SUBHARMONIC MIXER

BACKGROUND OF THE INVENTION

1. Field of the Invention

This invention relates to frequency mixers and, more particularly, to subharmonic mixers.

2. Related Art

A key principle of a frequency mixer is that, in mixing multiple electrical signals together, it adds and subtracts frequencies to produce new frequencies. In the field of signal processing, the process of multiplication in the time domain is recognized as equivalent to the process of convolution in the frequency domain. Mixers produce distortion or multiplication products that reduce or diminish the quality of the output signal. Much of the art and science of making good use of multiplication in mixing goes into minimizing these unwanted multiplication products (or their effects) and making multipliers provide their frequency translations as efficiently as possible.

Mixers can also create nonlinear distortion. Nonlinear distortion may take the form of harmonic distortion, in which integer multiples of input frequencies occur, or intermodulation distortion (IMD), in which different components multiply to form new components. Any departure from absolute linearity results in some form of nonlinear distortion.

Standard mixer design involves significantly nonlinear multiplication. Typically, the switching operation of a mixer causes the local oscillator signal ("LO") to act effectively as a square wave. There are several advantages to such switching action, including reduced noise, improved gain, insensitivity to device mismatch and variation, insensitivity to exact LO strength, and simplified design. A disadvantage, however, is that odd-order mixing products ("OMPs") are generated. An OMP is generally defined as the product of one input and an odd harmonic of another input.

The development of advanced receiver architectures, especially a direct conversion receiver (DCR), are greatly aided by use of a subharmonic mixer (SHM). While generally performing better than standard mixers in certain parameters important to DCR, a SHM generally underperforms in at least some of the more standard figures of merit (i.e. noise-figure (NF)) as compared to standard mixers.

The reason for the interest in a SHM for a DCR is due to the finite isolation between the radio frequency (RF) and LO paths. The problems of LO self-mixing and blocking signal coupling exist with a SHM. The undesired coupling of large blocking signals present in the RF path to the LO path cause direct current (DC) offsets at the output of the baseband signal. LO self-mixing and unmodulated blocker coupling cause DC offsets, which corrupt data in some modulation schemes, such as the modulation scheme used in Global System for Mobile communications (GSM).

Since an SHM uses a frequency that is one-half (½) of the frequency of the desired RF signal, the problem of parasitic coupling in a receiver using an SHM is greatly reduced. Ignoring second order effects, coupling of large blocking signals to the LO path no longer effects mixer operation. This is the main reason for the large interest in an SHM, even though they tend to be noiser than traditional mixers.

Two known techniques for building subharmonic mixers and especially subharmonic mixers that operate at one-half (½) the LO have several weaknesses. The best-known technique is that described in the paper "A Wide-Bandwidth Si/SiGe HBT Direct Conversion Sub-Harmonic Mixer/Downconverter," L. Sheng et al, IEEE Journal of Solid-State Circuits, Vol. 35, No. 9, September 2000. This technique involves stacking two standard, double-balanced mixer cores driven by ½ LO signals split 90 degrees. Two sets of hard-switched bipolar transistor pairs driven by ½ LO signals split by 90 degrees provide a functional equivalent of a downconverter that can be represented by the equation: $BB=RF*\sin(f_{lo}*t)*\cos(f_{lo}*t)=RF*\sin(2*f_{lo}*t)$, where BB is a baseband signal, $RF_{in}$ is the radio frequency input signal, and $f_{lo}$ is the local oscillator frequency. This method has several problems as compared to standard (Gilbert-style) mixers. One problem is that the use of two stacked cores requires significantly more headroom than a single core. Headroom is the amount of additional signal above the nominal input level that can be sent into or out of an electronic device before clipping distortion occurs. This not only means that the core requires extra headroom, but that the LO driving it is limited to avoid driving devices into saturation. Another problem is that the bottom stack's common-emitter node oscillates at $2*f_{lo}$, the receive frequency. This oscillating results in undesired mixing of large blocking signals and may desensitize the radio as a result. In addition, during the double mix-down that occurs, the receive frequency is mixed to a frequency near the LO, raising the possibility of IIP2 degradation. IIP2 is the theoretical input level at which the second-order two-tone distortion products are equal in power to the desired signals.

Another technique for building subharmonic mixers is described in U.S. Pat. No. 6,370,372 to Molnar et al., which is assigned to the assignee of the present invention and herein incorporated by reference. The technique described in this patent overcomes the above mentioned deficiencies by the use of a single four-way comparison SHM driven by carefully constructed stair waves which provide hard switching. This structure requires only one layer of switching core and its performance hinges on the generation of the stair waves. Four transistors driven by four 90-degree split stair waves guarantee only one device is on at a time, each for ¼ of an LO cycle. By summing the 0, 180 degree outputs and the 90, 270 degree outputs, one gets effective mixing at two times the LO frequency. One problem is that the mixer loads each stair wave asymmetrically (only the top ¼ of the signal actually drives a transistor that is on). This means that the stair waves tend to generate some $2^{nd}$ harmonic distortion. Another problem is that the stair wave requires twice as much headroom as is needed to switch the mixer core. As a result, headroom is limited by the drivers, making it harder to get very large swing and fast switching in the mixer core. A third problem is that the LO requires harmonic content ($3^{rd}$ order harmonic especially) to operate as a good stair wave, so inductance/capacitance (LC) tuning is not an option. Finally, to ensure hard switching without excessive swing, the drive impedance should preferrably be relatively low. All this contributes to a less than optimal NF and high power consumption in the LO drivers.

Therefore, there is a need for an SHM that includes the benefits of this type of mixer, while overcoming its problems.

SUMMARY

A subharmonic mixer and a method of downconverting a received radio frequency signal is described. The subharmonic mixer of the present invention uses two stacks of switching cores with high order symmetry to reduce unwanted harmonic generation and uses complementary metal-oxide semiconductor (CMOS) transistors to improve headroom.

In one embodiment, the subharmonic mixer includes a local oscillator interface, a first switching stage, a second switching stage, and a baseband output. The local oscillator interface receives a local oscillator signal. The local oscillator signal includes a waveform with four equally spaced phase components. The first switching stage receives an input current and the local oscillator signal to supply four intermediate currents. Each intermediate current is responsive to one of the phase components and the input current. The second switching stage receives the intermediate currents and the local oscillator signal to supply eight baseband currents. Each baseband current is responsive to one of the two phase components adjacent to the phase component used to generate the corresponding intermediate current. The baseband output is generated by summing the baseband currents.

In another embodiment, a method includes receiving an RF signal, providing four equally phase shifted local oscillator signals, mixing the RF signal with each of the four equally phase shifted local oscillator signals to generate intermediate frequency (IF) signals, mixing each of the IF signals with the two phase shifted local oscillator signals adjacent the local oscillator signal used to generate that IF signal to generate baseband (BB) signals, and summing the BB signals to provide a baseband output.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
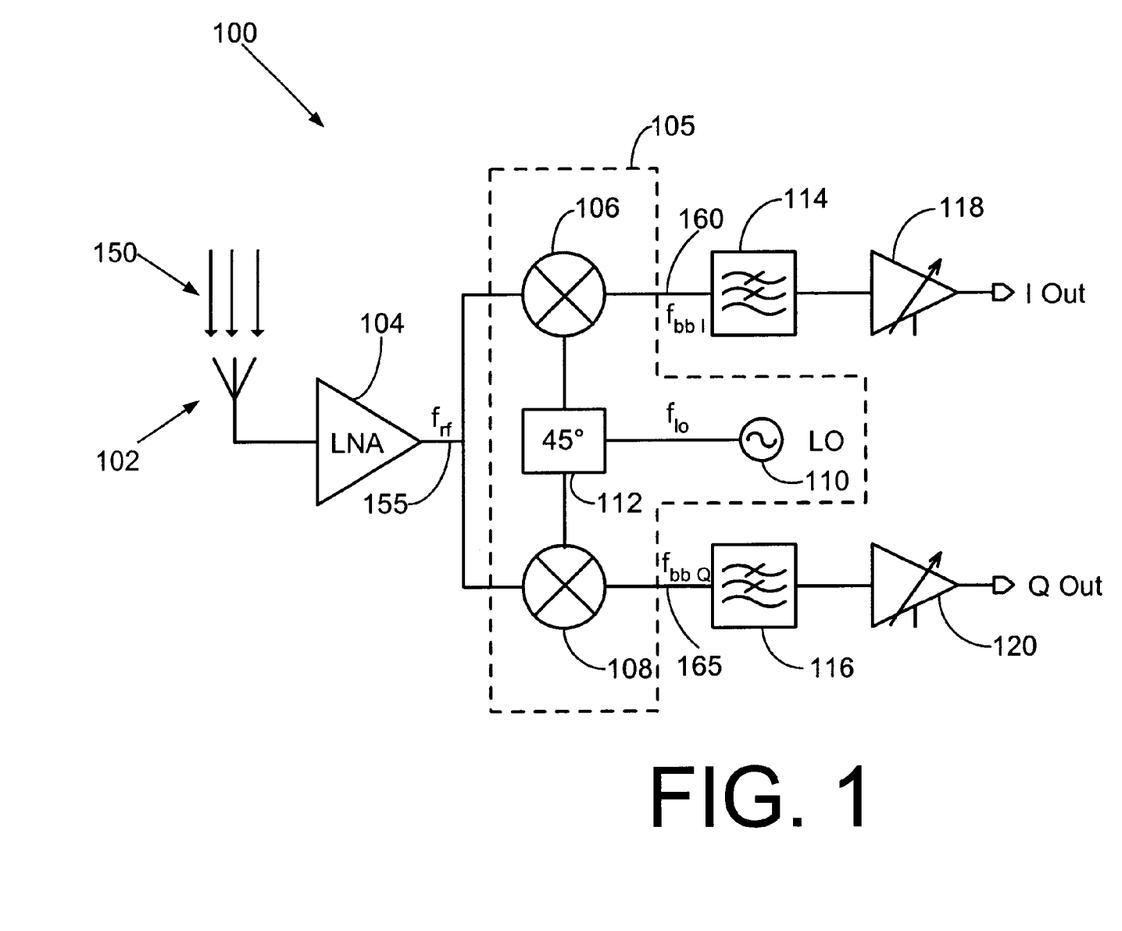
FIG. 1 is a block diagram illustrating a direct conversion receiver.

FIG. 1 is a block diagram illustrating a non-limiting example of a simplified direct conversion receiver 100 in which an embodiment of this invention may be implemented. Direct conversion receiver 100 includes antenna 102, low noise amplifier (LNA) 104, mixer stage 105, low pass filters 114, 116, and variable gain amplifiers 118, 120. A radio frequency signal 150 is received by antenna 102 and amplified by LNA 104 creating an amplified received signal on connector 155. The entire signal spectrum of the amplified received signal on connector 155 (termed $f_{rf}$) is frequency translated to a pair of baseband signals on connectors 160, 165 (termed $f_{bb}$) by mixer stage 105 utilizing two subharmonic mixers 106, 108, local oscillator (LO) 110, and phase shifter 112. The phase shifter 112 may comprise, for example, a polyphase filter, a frequency divider, a delay-locked loop, or any other phase shifting circuit that is known in the art.

Each subharmonic mixer 106, 108 effectively works as two switching stages connected in series. By varying the phase of LO 110 signal, $f_{lo}$, and mixing $f_{lo}$ with $f_{rf}$, the first stage translates the amplified received signal $f_{rf}$ to an intermediate frequency $f_{rf}$. The second stage translates the intermediate frequency $f_{rf}$ to baseband by mixing $f_{lo}$ shifted by approximately +90° and -90° with the intermediate frequency to produce $f_{bb}$. Phase shifter 112 varies the phase of LO 110 signal, $f_{lo}$, used for mixer 108 to approximately 45° out of phase of LO 110 signal, $f_{lo}$, used for mixer 106 allowing alternating in-phase (I) and quadrature (Q) components to be derived from the amplified received signal $f_{rf}$. The baseband signals 160, 165 undergo further conditioning using low pass filters 114, 116 and variable gain amplifiers 118, 120, respectively.

Both subharmonic mixers 106, 108 in FIG. 1 are driven by an LO 110 signal, the frequency of which is approximately one-half of the frequency driving conventional downconversion mixers. Prior art mixers are driven by LO signals at 0° and 90°, whereas subharmonic mixers 106, 108 are driven by LO signals at 0° and 45°. Even though subharmonic mixers 106, 108 are driven by a LO signal, the frequency shift of which is approximately halved, the output of mixer stage 105 still produces I and Q baseband components that are 90° out of phase with respect to each other. The process of performing two switching operations causes the frequency to double and thereby the phase difference is also doubled.

Each subharmonic mixer 106, 108 receives two inputs. Input to subharmonic mixer 106 is the LO signal $f_{lo}$, and the amplified received signal $f_{rf}$. The LO signal $f_{lo}$, includes phase components $f_{lo}(0°)$, $f_{lo}(90°)$, $f_{lo}(180°)$, and $f_{lo}(270°)$. Mixing these phase components of $f_{lo}$ with $f_{rf}$ produces the in-phase (I) baseband component $f_{bb\ I}$. Input to subharmonic mixer 108 is the LO signal $f_{lo}$, and the amplified received signal $f_{rf}$. The LO signal $f_{lo}$, includes phase components $f_{lo}(45°)$, $f_{lo}(135°)$, $f_{lo}(225°)$, and $f_{lo}(315°)$. Mixing these phase components of $f_{lo}$ with $f_{rf}$ produces the quadrature (Q) baseband component $f_{bb\ Q}$.

Figure 2:
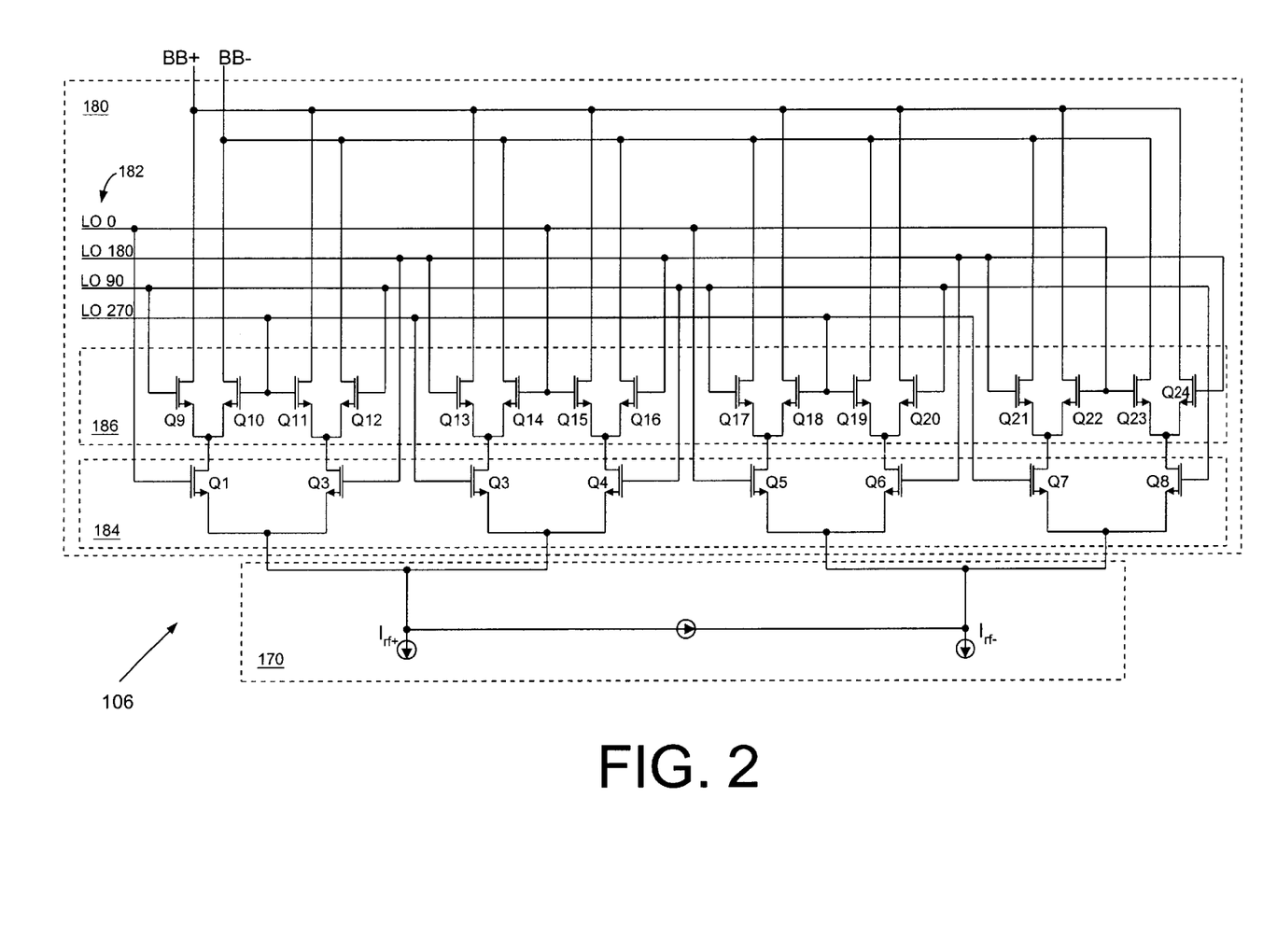
FIG. 2 is a block diagram illustrating an embodiment of a double balanced subharmonic mixer contained in the direct conversion receiver illustrated in FIG. 1.

FIG. 2 is a schematic diagram illustrating an embodiment of the subharmonic mixer 106 shown in FIG. 1 in the form of a double-balanced mixer. Subharmonic mixer 106 is commonly referred to as an "I-mixer" since it produces the I baseband ($f_{bb\ I}$) component of received signal, $f_{rf}$. Subharmonic mixer 106 includes an RF input section 170 and a mixer core 180. The mixer core 180 includes an LO interface 182 for receiving an LO signal and two switching stages 184, 186 for providing output baseband signals. The RF input section 170 provides a first current to transistors Q1–Q4 and a second current to transistors Q5–Q8. The first switching stage of the mixer core includes eight transistors Q1–Q8. The first switching stage is coupled to the second switching stage of the mixer for supplying a third current to transistors Q9, Q10, a fourth current to transistors Q11, Q12, a fifth current to transistors Q13, Q14, a sixth current to transistors Q15, Q16, a seventh current to transistors Q17, Q18, an eighth current to transistors Q19, Q20, a ninth current to transistors Q21, Q22, and a tenth current to transistors Q23, Q24. The second switching stage includes sixteen transistors Q9–Q24 for providing output baseband siganls BB+, BB–.

In the embodiment illustrated in FIG. 2, the amplified received signal, $f_{rf}$, is inputted to transistors Q1–Q4 and Q5–Q8 as current flows $I_{rf}+$ and $I_{rf}-$, respectively. Each current flow is mixed with LO components in the first switching stage to produce a current which is at an intermediate frequency. Switching is essentially a multiplying action that in this embodiment mixes the input signal to a lower frequency. The current at the intermediate frequency is mixed with LO components in the second switching stage to produce the I baseband component.

Figure 3:
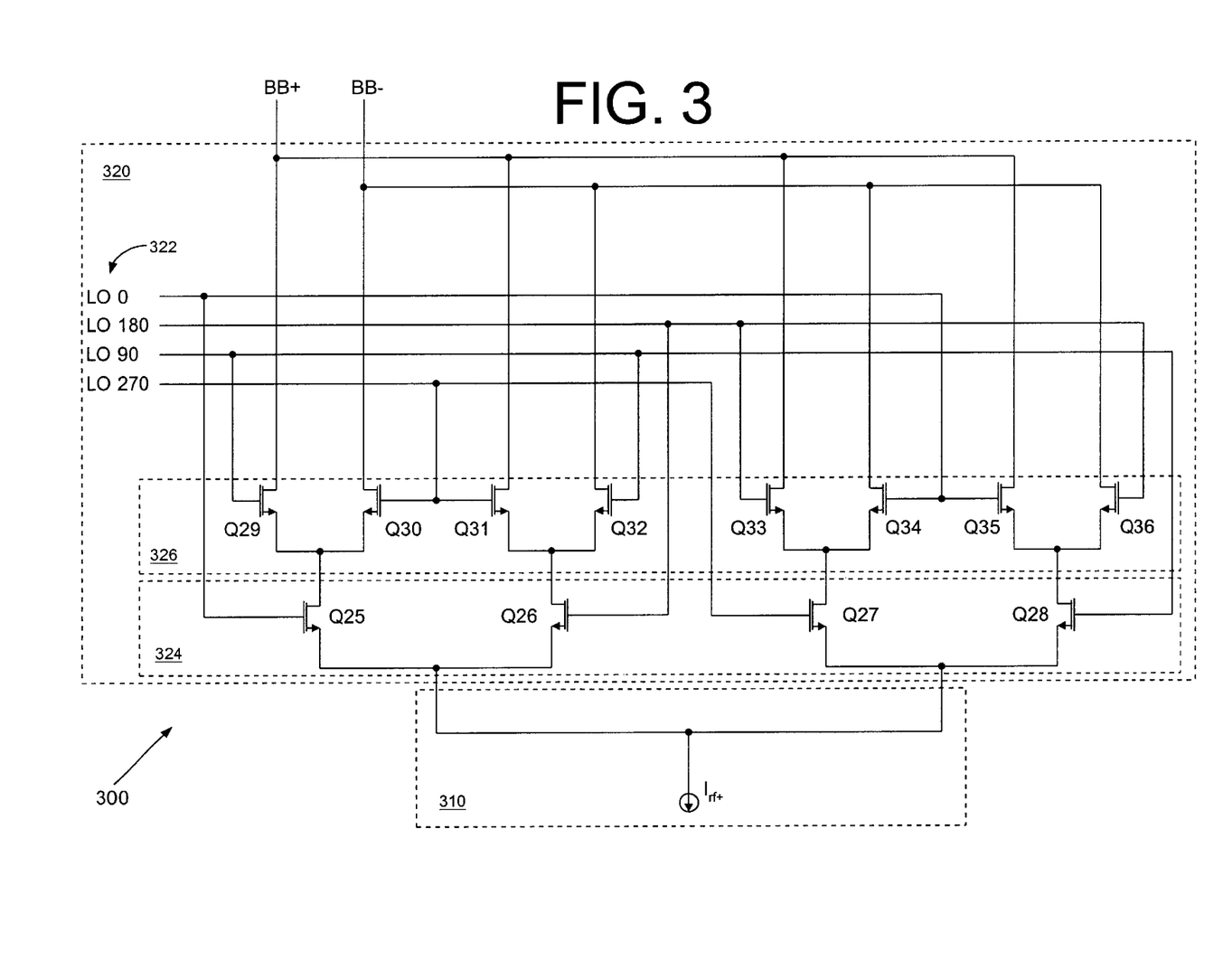
FIG. 3 is a block diagram illustrating a single balanced subharmonic in-phase mixer.

FIG. 3 is a schematic diagram of an embodiment of subharmonic mixer 106 of FIG. 1 in the form of a single-balanced mixer. Subharmonic mixer 300 is commonly referred to as a "I-mixer" since it produces the I baseband ($f_{bb_I}$) component of received signal, $f_{rf}$. Subharmonic mixer 300 includes an RF input section 310 and a mixer core 320. The mixer core 320 includes an LO interface 322 for receiving an LO signal and two switching stages 324, 326 for providing output baseband signals. The RF input section 310 provides a first current to the first switching stage 324. The first switching stage 324 of the mixer core 320 includes four transistors Q25–Q28. The first switching stage 324 is coupled to the second switching stage 326 having eight transistors Q29–Q36. The first switching stage 324 of the mixer 300 supplies a second current to transistors Q29, Q30, a third current to transistors Q31, Q32, a fourth current to transistors Q33, Q34, and a fifth current to transistors Q35, Q36. The output of the second switching stage provides output baseband siganls BB+, BB−.

In the embodiment illustrated in FIG. 3, the amplified received signal, $f_{rf}$, is inputted to transistors Q25–Q28 as current flow $I_{rf}+$. The current flow $I_{rf}+$ is mixed with LO components in the first switching stage 324 to produce a current which is at an intermediate frequency. Switching is essentially a multiplying action that in this embodiment mixes the input signal to a lower frequency. The current at the intermediate frequency is mixed with LO components in the second switching stage to produce the I baseband component.

Figure 4:
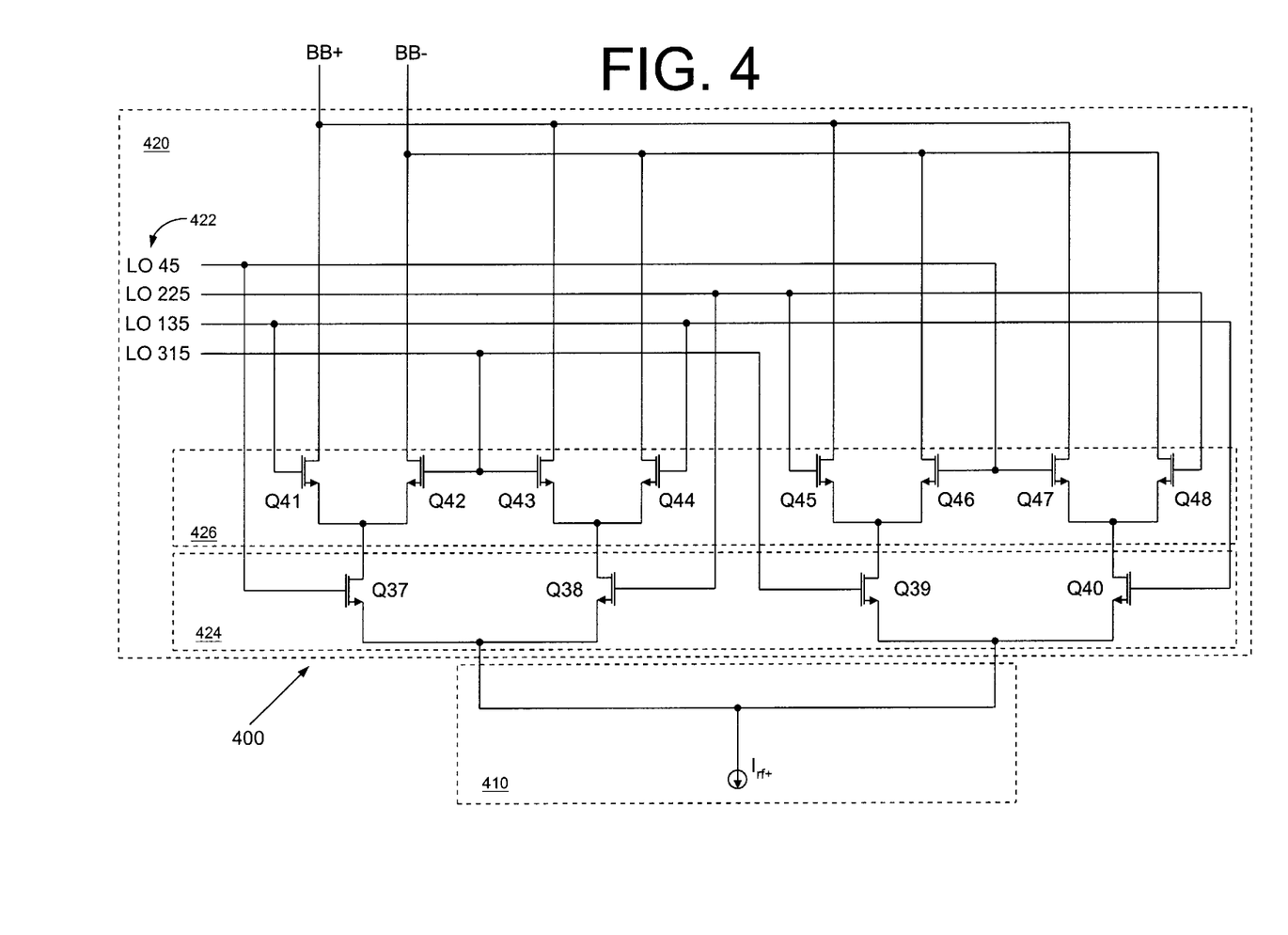
FIG. 4 is a block diagram illustrating a single balanced subharmonic quadrature mixer.

FIG. 4 is a schematic diagram of an embodiment of subharmonic mixer 108 of FIG. 1 in the form of a single-balanced mixer. Subharmonic mixer 400 is commonly referred to as a "Q-mixer" since it produces the Q baseband ($f_{bb_Q}$) component of received signal, $f_{rf}$. Subharmonic mixer 400 includes an RF input section 410 and a mixer core 420. The mixer core 420 includes an LO interface 412 for receiving an LO signal and two switching stages 414, 416 for providing output baseband signals. The RF input section 410 provides a first current to the first switching stage 424. The first switching stage 424 of the mixer core 420 includes four transistors Q37–Q40. The first switching stage 424 is couple to the second switching stage 426 having eight transistors Q41–Q48. The first switching stage 424 of the mixer 400 supplies a second current to transistors Q41, Q42, a third current to transistors Q43, Q44, a fourth current to transistors Q45, Q46, and a fifth current to transistors Q47, Q48. The output of the second switching stage provides output baseband siganls BB+, BB−.

In the embodiment illustrated in FIG. 4, the amplified received signal, $f_{rf}$, is inputted to transistors Q37–Q40 as current flow $I_{rf}+$. The current flow $I_{rf}+$ is mixed with LO components in the first switching stage 424 to produce a current which is at an intermediate frequency. Switching is essentially a multiplying action that in this embodiment mixes the input signal to a lower frequency. The current at the intermediate frequency is mixed with LO components in the second switching stage 426 to produce the Q baseband component.

Figure 5:
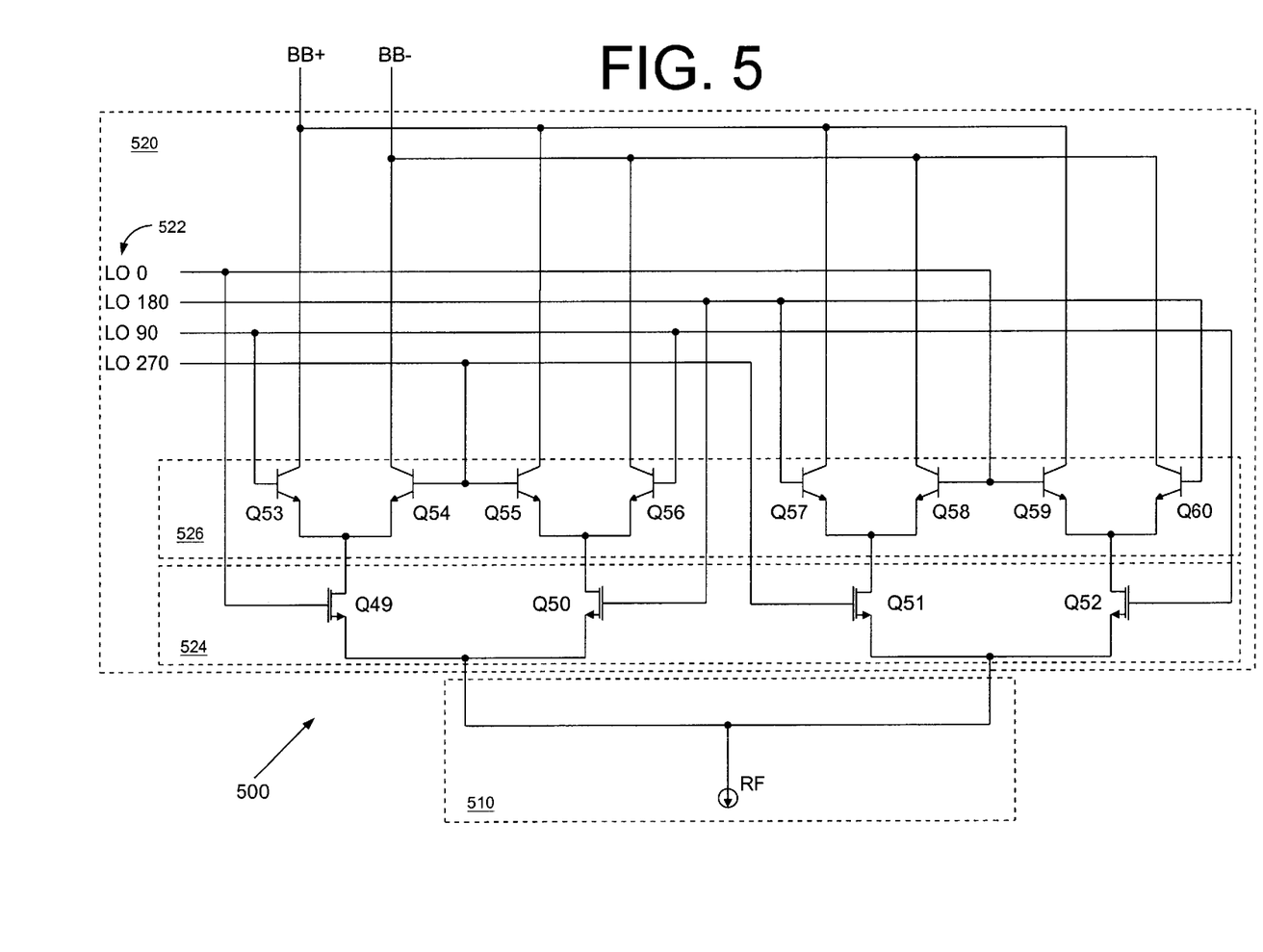
FIG. 5 is a block diagram illustrating another single balanced subharmonic in-phase mixer using bipolar junction transistors in the second stage of the mixer.

FIG. 5 is a schematic diagram of an embodiment of subharmonic mixer 106 of FIG. 1 in the form of a hybrid single-balanced mixer. Subharmonic mixer 500 is commonly referred to as a "I-mixer" since it produces the I baseband ($f_{bb_I}$) component of received signal, $f_{rf}$. Subharmonic mixer 500 includes an RF input section 510 and a mixer core 520. The mixer core 520 includes an LO interface 522 for receiving an LO signal and two switching stages 524, 526 for providing output baseband signals. The RF input section 510 provides a first current to the first switching stage 524. The first switching stage 524 of the mixer core 520 includes four N-channel field-effect transistors Q49–Q52. The first switching stage 524 is coupled to the second switching stage 526 having eight npn bipolar junction transistors Q53–Q60. The first switching stage 524 of the mixer 500 supplies a second current to transistors Q53, Q54, a third current to transistors Q55, Q56, a fourth current to transistors Q57, Q58, and a fifth current to transistors Q59, Q60. The output of the second switching stage provides output baseband siganls BB+, BB−.

In the embodiment illustrated in FIG. 5, the amplified received signal, $f_{rf}$, is inputted to transistors Q49–Q52 as current flow $I_{rf}+$. The current flow $I_{rf}+$ is mixed with LO components in the first switching stage 524 to produce a current which is at an intermediate frequency (IF). Switching is essentially a multiplying action that in this embodiment mixes the input signal to a lower frequency. The current at the intermediate frequency is mixed with LO components in the second switching stage to produce the I baseband component.

The hybrid single-balanced subharmonic mixer of FIG. 5 can also be implemented as a doubled-balanced subharmonic mixer.

Figure 6:
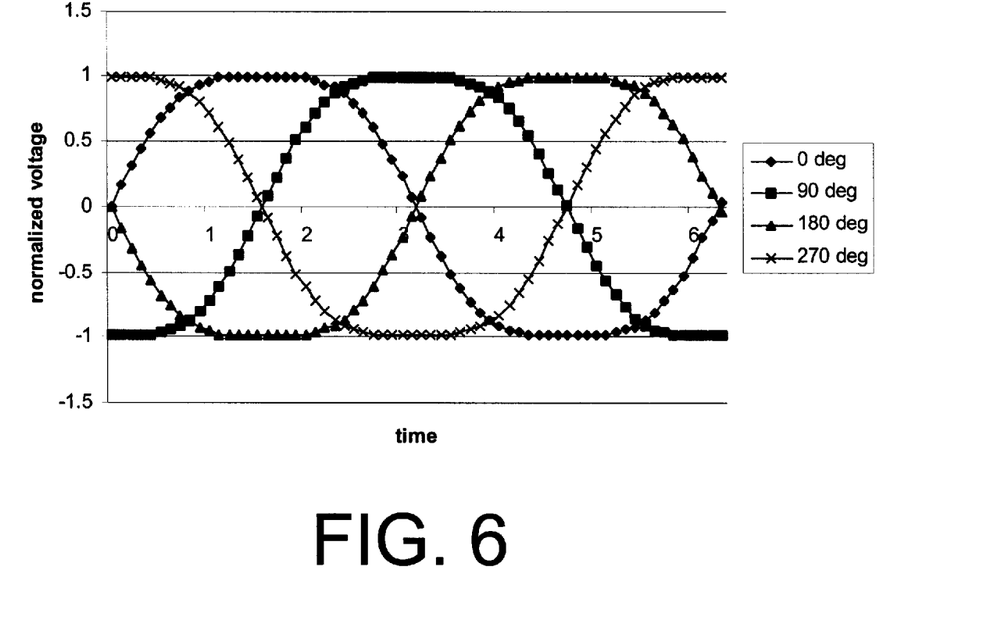
FIG. 6 is a timing diagram illustrating local oscillator outputs to the subharmonic mixer of FIG. 3.
Figure 7:
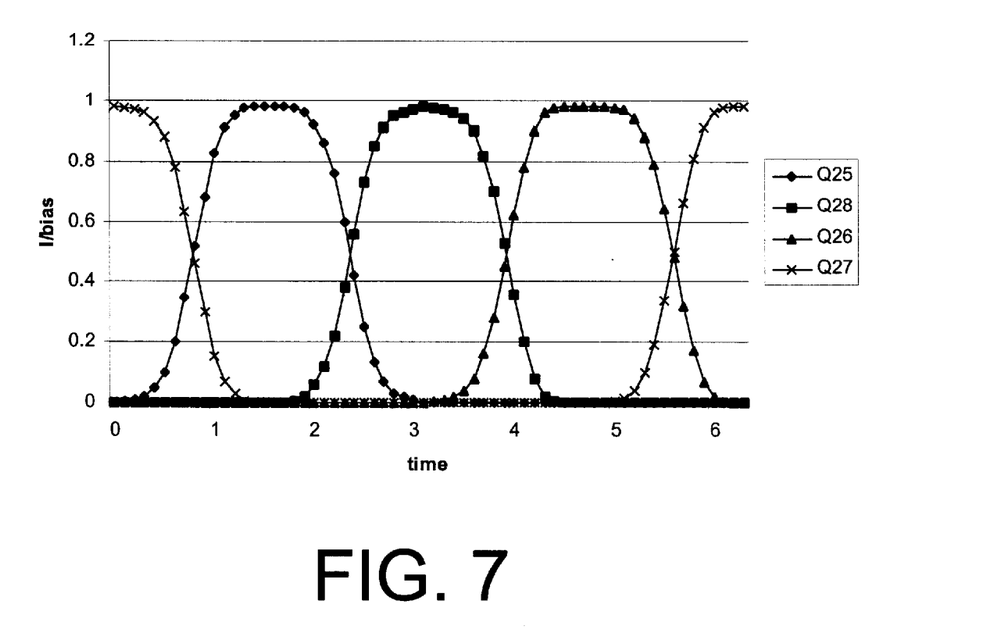
FIG. 7 is a timing diagram illustrating the current outputs of the first stage of the subharmonic mixer of FIG. 3.
Figure 8:
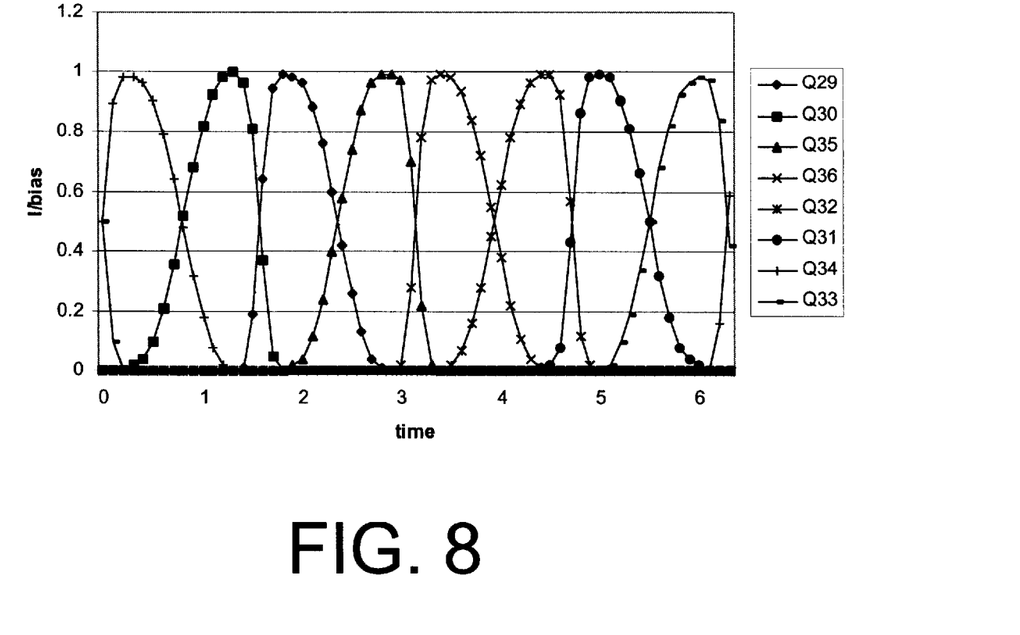
FIG. 8 is a timing diagram illustrating the current outputs of the second stage of the subharmonic mixer of FIG. 3.
Figure 9:
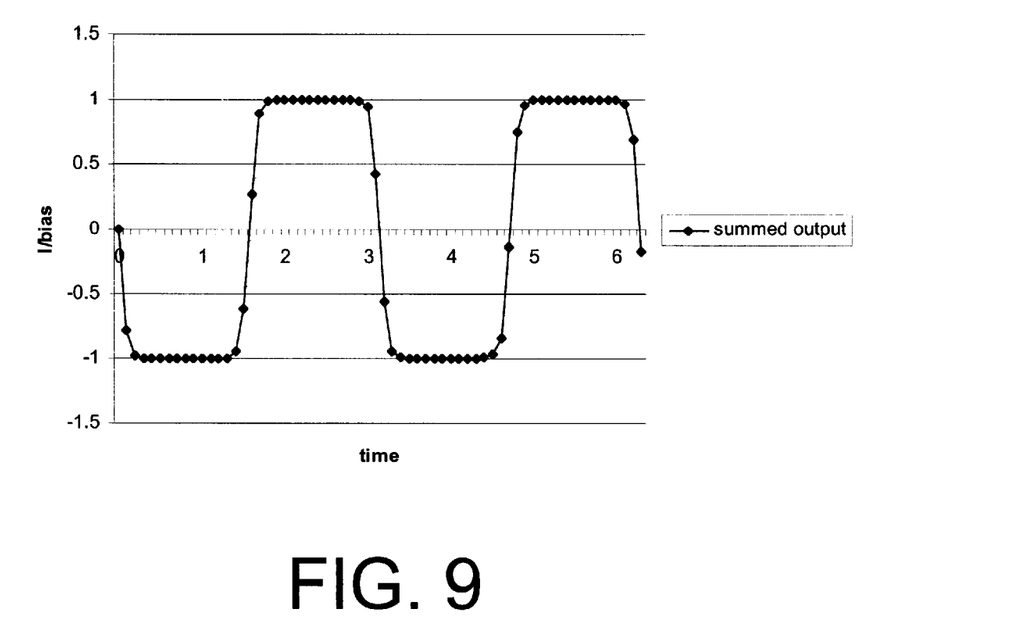
FIG. 9 is a timing diagram illustrating the combining of the outputs of the second stage of the subharmonic mixer of FIG. 3.

FIGS. 6–9 show various examples of waveforms relevant to the signal processing generated by the circuit in FIG. 3. FIG. 6 shows the four 90 degree split LO signals that drive the mixer. As shown in FIG. 7, the first switching stage of transistors is not especially hard-switched, and their switching points occur between zero crossing of the various LO signals resulting in four 90 degree split signals. The second switching stage of transistors divide these four signals into eight signals with fast, hard-switched transitions. As a result, each second stage transistor generates a pulse with one fast edge and one slow edge as shown in FIG. 8. In FIG. 9, the outputs of the second switching stage are summed such that the overall differential mixing term switches at twice the LO frequency but only on the fast transitions.

Although the inventive mixer is double-balanced, it is easier to understand the functioning of the mixer in a single-balanced mixer form as shown in FIG. 3 using FIGS. 6–9. The local oscillator (LO) signal may be either a square or sinusoidal wave generator. For this example, a sinusoidal wave generator is used to provide the four LO outputs shown in FIG. 6. Each of the four LO outputs drive one transistor in the first switching stage and two transistors in the second switching stage. An output of each first switching stage transistor drives two second switching stage transistors. The phase of the LO driving a given first switching stage transistor is offset from the phase of the LO signals driving the two second stage switching transistor driven by the given first switching stage transistor by +/−90 degrees. The output of each of the four transistors in the first switching stage is shown in FIG. 7. The output of each of the eight transistors in the second switching stage is shown in FIG. 8. The result of the mixing the outputs of the second stage switching devices, as shown in FIG. 9, is BB=$RF_{in}$*sin($f_{lo}$*t)*cos($f_{lo}$*t)=$RF_{in}$*sin(2*$f_{lo}$*t), where BB is the baseband signal, $RF_{in}$ is the radio frequency input signal, $f_{lo}$ is the local oscillator frequency.

The inventive subharmonic mixer structure has four-way symmetry. The four-way symmetry has several important effects. One is that it guarantees that the four LO signals are symmetrically loaded. This symmetry is important for preserving the 90 degree phase-splits in the LO. A non-90 degree phase-split permits leakage of the direct current (DC) signals from the RF port to baseband, usually at the expense of IIP2. The four-way symmetry also suppresses the generation of $2*f_{lo}$ at the RF port and provides anti-phase generation of $2*f_{lo}$ signals everywhere else. Hence, this design improves both of the primary DCR-specific mixer specifications (LO re-radiation and IIP2).

Use of the four-way symmetry also allows the first switching stage set of transistors to operate as a four-way comparator, meaning that the transistors are unlikely to be especially hard-switched (see FIG. 7). Indeed, use of clipped waveforms, which usually increase hard switching, make this effect worse. Normally, this would result in a bad noise-figure and low gain. However, the inclusion of the second switching stage prevents the use of clipped waveforms from being a problem. The second switching stage is hard switched and comprises different pairs of transistors driven by anti-phase LO signals. As can be seen in FIG. 8, each output of a second switching stage transistor undergoes two transitions, a fast one when the transistor itself turns on/off, and a slow one when the first switching stage transistor driving it turns on/off. The slow transitions are passed by the first switching stage through the second switching stage and to the output. The connectivity at the output, however, assures that the two outputs on either side of a slow transition are recombined (i.e., in FIG. 8, outputs of Q29 and Q35 are summed). This leads to the conclusion that the behavior of the transitions between any given pair of first switching stage transistors has no effect on the output. As shown in FIG. 9, the output is hard switched according to the fast transitions of the second switching stage only. This means that the first switching stage to the first order contributes no phase noise, no mismatch effects, no gain loss or any other affect related to transistor transitions. Furthermore, since the output of a given first switching stage transistor is split evenly between the two outputs, 1/f noise or other near-DC effects in the first switching stage are up converted by the second switching stage and do not leak to the output in the form of baseband signals.

Therefore the first switching stage can be driven hard without much penalty to performance. This allows the use of small, short-channel, N-channel field-effect transistors (NFET) driven into a triode state and still allow reasonable performance, which is important since it means the LO lines driving the second switching stage also can be DC coupled to the first switching stage. Putting the first switching stage transistors into a triode state also increases headroom and/or permits use of a larger input swing on the LO lines. Only the second switching stage should have hard switching. Since the second switching stage devices transition on the zero-crossings of their respective anti-phase LO signals, the LO signals can be sinusoids or square waves without the performance penalty that comes with a four-way comparison SHM.

While FIGS. 1 and 2 show the inventive subharmonic mixer implemented using N-channel metal-oxide semiconductors (NMOS), it is equally possible to implement the subharmonic mixer using P-channel metal-oxide semiconductors (PMOS), with the associated cost in speed and improvement in flicker noise.

An alternative embodiment is a bipolar version of the above design. However, the first switching stage should preferably be kept out of saturation.

While various embodiments of the invention have been described, it will be apparent to those of ordinary skill in the art that many more embodiments and implementations are possible that are within the scope of this invention.

What is claimed is:

1. A subharmonic mixer comprising:
   a local oscillator interface for receiving a local oscillator signal, the local oscillator signal including a waveform with four equally spaced phase components;
   a first switching stage for receiving an input current and the local oscillator signal to supply four intermediate currents, each intermediate current being responsive to one of the phase components and the input current; and
   a second switching stage for receiving the intermediate currents and the local oscillator signal to supply eight baseband currents, each baseband current being responsive to one of the two phase components adjacent to the phase component used to generate the corresponding intermediate current; and
   a baseband output generated by summing the baseband currents.

2. The mixer of claim 1, wherein the four phase components include a 0° phase component, a 90° phase component, a 180° phase component, and a 270° phase component.

3. The mixer of claim 1, wherein the four phase components include a 45° phase component, a 135° phase component, a 225° phase component, and a 315° phase component.

4. The mixer of claim 1, wherein the baseband output includes a pair of components, each component generated by summing four of the baseband currents.

5. The mixer of claim 1, wherein the first switching stage includes complementary metal-oxide semiconductor transistors.

6. The mixer of claim 1, wherein the first switching stage includes N-channel metal-oxide semiconductors transistors.

7. The mixer of claim 6, wherein the second switching stage includes npn bipolar junction transistors.

8. The mixer of claim 1, wherein the first switching stage includes P-channel metal-oxide semiconductors transistors.

9. The mixer of claim 1, wherein the second switching stage includes complementary metal-oxide semiconductor transistors.

10. The mixer of claim 1, wherein the second switching stage includes N-channel metal-oxide semiconductors transistors.

11. The mixer of claim 1, wherein the second switching stage includes P-channel metal-oxide semiconductors transistors.

12. The mixer of claim 1, wherein the mixer is a single-balanced mixer.

13. The mixer of claim 1, wherein the mixer is a double-balanced mixer.

14. A method for downconverting a received radio frequency (RF) signal comprising;
   receiving a RF signal;
   providing four equally phase shifted local oscillator signals;
   mixing the RF signal with each of the four equally phase shifted local oscillator signals to generate intermediate frequency (IF) signals;
   mixing each of the IF signals with the two phase shifted local oscillator signals adjacent the local oscillator signal used to generate that IF signal to generate baseband (BB) signals; and
   summing together the BB signals to provide a baseband output.

15. The method of claim 14, wherein the summing step includes:
   summing one half of the BB signals to provide a first component of the baseband output; and
   summing an other half of the BB signals to provide a second component of the baseband output.

16. The method of claim 14, wherein the RF signal includes a positive and a negative component.

17. The method of claim 16, wherein mixing the RF signals includes mixing each of the components with the four equally phase shifted local oscillator signals to generate eight intermediate frequency signals.

18. The method of claim 17, wherein mixing the IF signals includes mixing each of the intermediate frequency signals with the two local oscillator signals that are adjacent to the local oscillator signal used to generate that intermediate frequency signal to generate sixteen baseband signals.

19. A subharmonic mixer comprising:

a local oscillator interface for receiving a local oscillator signal, the local oscillator signal including a four equally spaced phase components;

a first switching stage for receiving a first and second current and the local oscillator signal to supply eight intermediate currents, each intermediate current being responsive to one of the phase components and to one of the first and second currents; and a second switching stage for receiving the intermediate currents and the local oscillator signal to supply sixteen baseband currents, each baseband current being responsive to one of the two phase components adjacent to the phase component used to generate the corresponding intermediate current; and a baseband output generated by summing the baseband currents.

20. The mixer of claim 19, wherein the baseband output includes a pair of components, each component generated by summing eight of the baseband currents.

* * * * *